United States Patent
Sim

(12) 
(10) Patent No.: US 6,734,761 B2
(45) Date of Patent: May 11, 2004

(54) RADIO-FREQUENCY INPUT STAGE

(75) Inventor: Sanggyu Sim, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/364,015

(22) Filed: Feb. 10, 2003

(65) Prior Publication Data

US 2003/0132819 A1 Jul. 17, 2003

Related U.S. Application Data

(63) Continuation of application No. PCT/DE01/03012, filed on Aug. 7, 2001.

(30) Foreign Application Priority Data

Aug. 10, 2000 (DE) .......................................... 100 39 191

(51) Int. Cl.[7] .............................................. H03H 7/01
(52) U.S. Cl. ........................ 333/174; 333/104; 333/125
(58) Field of Search ............................... 333/100, 174, 333/175, 104, 125; 334/1; 455/178.1, 179.1, 188.2, 189.1, 191.1, 193.2, 266, 311

(56) References Cited

U.S. PATENT DOCUMENTS

| | | | |
|---|---|---|---|
| 4,037,177 A | * | 7/1977 | Tyrey .......................... 333/174 |
| 4,577,171 A | * | 3/1986 | Heigl et al. ..................... 334/1 |
| 4,771,332 A | | 9/1988 | Metoki |
| 4,851,796 A | | 7/1989 | Hendriks |
| 4,907,292 A | * | 3/1990 | Leipert ..................... 455/191.1 |
| 5,752,179 A | * | 5/1998 | Dobrovolny ................. 455/266 |
| 5,978,663 A | | 11/1999 | Yamamoto |
| 6,169,569 B1 | * | 1/2001 | Widmer et al. ............. 455/311 |
| 6,525,600 B1 | * | 2/2003 | Musiol et al. .............. 333/174 |

FOREIGN PATENT DOCUMENTS

| | | |
|---|---|---|
| EP | 0 299 578 A1 | 1/1989 |
| GB | 528403 | 4/1940 |
| JP | 59051617 | 3/1984 |
| WO | WO 00/11783 | 3/2000 |

* cited by examiner

Primary Examiner—Robert Pascal
Assistant Examiner—Dean Takaoka
(74) Attorney, Agent, or Firm—Laurence A. Greenberg; Werner H. Stemer; Gregory L. Mayback

(57) ABSTRACT

A radio-frequency input stage is specified and has a radio-frequency coupling element which couples an air interface to the inputs of parallel-connected radio-frequency resonant circuits. In order to allow a circuit configuration which has no switches and is of simple construction, only one capacitance, which forms a low-pass filter, is provided in the coupling element, and splits an antenna signal between the various bands, in the process suppressing influences from bands other than that which has been selected. The radio-frequency input stage can be used, for example, in three-band TV tuners.

10 Claims, 1 Drawing Sheet

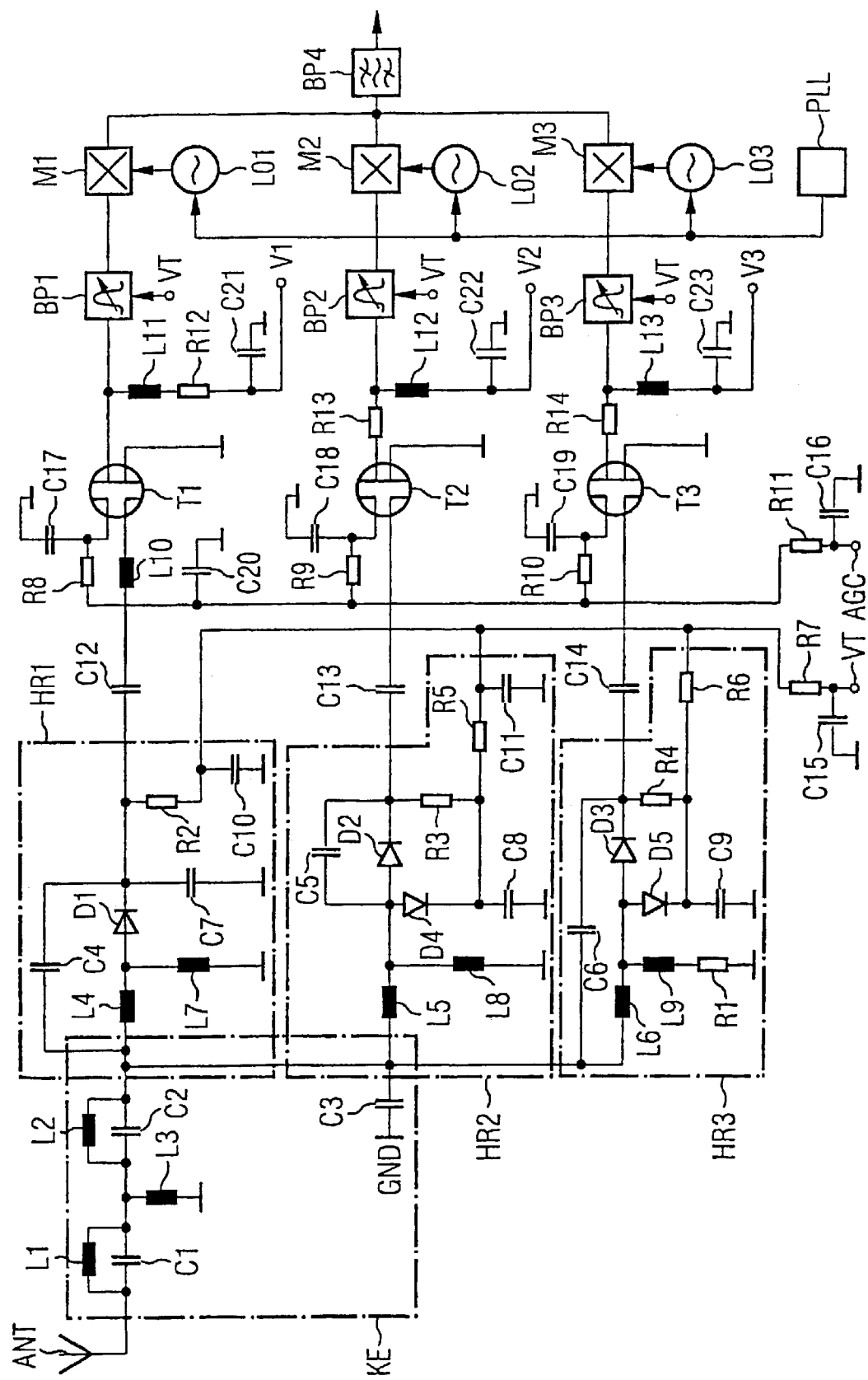

RADIO-FREQUENCY INPUT STAGE

CROSS-REFERENCE TO RELATED APPLICATION

This application is a continuation of copending International Application No. PCT/DE01/03012, filed Aug. 7, 2001, which designated the United States and was not published in English.

BACKGROUND OF THE INVENTION

Field of the Invention

The present invention relates to a radio-frequency input stage having a radio-frequency coupling element to which an input signal can be supplied and which is coupled to a first and to a second tunable radio-frequency resonant circuit, which are connected to one another on the input side.

Radio-frequency input stages (front ends) with tunable radio-frequency resonant circuits which are connected in parallel with one another and are configured for different frequency bands are normally provided in two-band and three-band TV tuners.

A radio-frequency input circuit of this generic type is specified in the document Published, European Patent Application EP 0 299 578 A1, corresponding to U.S. Pat. No. 4,851,796.

There, a radio-frequency coupling element is connected on one side to an antenna and on the other side to in each case one first, one second and one third radio-frequency resonant circuit. The coupling element is in this case formed from an η section with a series capacitance and two shunt paths.

SUMMARY OF THE INVENTION

It is accordingly an object of the invention to provide a radio-frequency input stage that overcomes the above-mentioned disadvantages of the prior art devices of this general type, which has a simple circuit configuration, is improved with regard to the mutual interference between the individual bands, and can be produced at low cost.

With the foregoing and other objects in view there is provided, in accordance with the invention, a radio-frequency input stage. The input stage contains a first tunable radio-frequency resonant circuit having an input, a second tunable radio-frequency resonant circuit having an input connected to the input of the first tunable radio-frequency resonant circuit, and a radio-frequency coupling element for receiving an input signal and coupled to the first and second tunable radio-frequency resonant circuits. The radio-frequency coupling element contains a reference-ground potential terminal and a capacitive element having a first terminal coupled to the first and second tunable radio-frequency resonant circuits and a second terminal connected to the reference-ground potential terminal.

According to the invention, the object is achieved by a radio-frequency input stage of the type mentioned initially in which the coupling element has a capacitive element which is coupled on one side to the first and second radio-frequency resonant circuits, and is coupled on the other side to the reference-ground potential connection.

The radio-frequency input stage does not require any changeover switches between the individual tuning circuits. Each radio-frequency resonant circuit can be configured for its own frequency band. The individual frequency bands may be adjacent. The capacitive element, which forms a low-pass filter, effectively suppresses the undesirable influences in particular of the low and possibly central frequency band on the high frequency band.

The splitting of a radio-frequency received signal (which, for example, is input at an antenna) into the various frequency bands and between the various resonant circuits is carried out by a simple parallel circuit. No switching diodes are required for this purpose. The described configuration can be produced in a simple and low-cost manner and is improved with regard to the suppression of undesirable influences on bands that have in each case not been selected.

In one advantageous embodiment of the present invention, the radio-frequency coupling element has a high-pass filter. For television or radio reception, for example, the desired frequency band or the desired frequency bands is or are not close to 0 Hertz, so that undesirable frequencies which are below the desired frequency bands can be suppressed by a high-pass filter.

In a further advantageous embodiment of the present invention, the high-pass filter has an inductance, which is connected on one side to the air interface and to the radio-frequency resonant circuits, and is connected on the other side to the reference-ground potential. This allows a particularly simple implementation of a high-pass filter.

In a further advantageous embodiment of the present invention, a third, tunable radio-frequency resonant circuit is provided, and is connected in parallel with the first and second radio-frequency resonant circuits. A third, tunable radio-frequency resonant circuit can be used to produce a three-band TV tuner which, for example, can cover a range from 470 to 960 MHz in a first frequency band, a range from 160 to 470 MHz in a second frequency band, and a frequency range from 40 to 160 MHz in a third band.

In a further advantageous embodiment of the present invention, the radio-frequency resonant circuits each have a series inductance on the input side for impedance conversion, one side of which is in each case connected to the coupling element. The impedance conversion is particularly advantageous for matching the impedance (which varies as a result of the tuning of the resonant circuit) of the resonant circuit to that of the air interface.

In a further advantageous embodiment of the present invention, the radio-frequency resonant circuits each have an inductance in parallel with a series circuit formed from a capacitance diode and a capacitance. The resonant circuits may be controllable by a common tuning voltage, by the capacitance diodes each having a variable capacitance.

In a further advantageous embodiment of the present invention, a capacitance for suppressing mirror-image frequencies is in each case connected between an input, which is connected to the coupling element, and an output, which is coupled to an amplifier, of the radio-frequency resonant circuits. It may be desirable to suppress mirror-image frequencies when, for example, mixers are provided for conversion of an amplified output signal from the resonant circuits to an intermediate-frequency signal.

In a further advantageous embodiment of the present invention, a capacitance for widening the bandwidth of the respective resonant circuit is connected between the series inductance and an output, which is coupled to an amplifier, of the radio-frequency resonant circuits.

In a further advantageous embodiment of the present invention, the coupling element has a first bandstop filter for suppressing undesirable intermediate frequencies.

In a further advantageous embodiment of the present invention, the coupling element has a second bandstop filter for suppressing further undesirable frequencies, and the second bandstop filter is connected upstream by the first bandstop filter. By way of example, the second bandstop filter may be configured such that it suppresses signals in the frequency range of the so-called citizen band (CB). The first and second bandstop filters may, for example, be formed by an inductance which is connected in parallel with a capacitance and may, for example, be connected on the input side to an antenna and on the output side to the inputs of the resonant circuits. The first and second bandstop filters may in this case be connected in series with one another, with the intermediate-frequency bandstop filter advantageously being connected downstream from the second bandstop filter. In particular, in this case, a connecting node, to which a high-pass filter can be connected, may be formed between the bandstop filters.

In a further advantageous embodiment of the present invention, finally, the capacitive element has a capacitance value of 0.5 picofarads and the radio-frequency input stage has an overall tuning range from 40 to 870 MHz.

The first radio-frequency resonant circuit may in this case be configured for a high frequency band, the second radio-frequency resonant circuit for a central frequency band, and the third radio-frequency resonant circuit for a low frequency band. The capacitive element which forms the low-pass filter may advantageously be disposed closer to the second radio-frequency resonant circuit than to the first radio-frequency resonant circuit in a practical circuit implementation, so that this results in a shorter connection to the former than to the latter, in which case the coupling element may be connected closer to the input of the first radio-frequency resonant circuit than to the input of the second radio-frequency resonant circuit.

Other features which are considered as characteristic for the invention are set forth in the appended claims.

Although the invention is illustrated and described herein as embodied in a radio-frequency input stage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a circuit diagram of an exemplary embodiment of a radio-frequency input stage according to the invention.

DESCRIPTION OF THE PREFERRED EMBODIMENTS

Referring now to the single FIGURE of the drawing in detail, there is shown a three-band TV tuner with an antenna ANT, a coupling element KE connected to the antenna ANT, and three parallel-connected radio-frequency resonant circuits HR1, HR2 and HR3 that are connected to the coupling element KE. The radio-frequency resonant circuits HR1, HR2, HR3 are followed by a respective transistor T1, T2, T3, connected as an amplifier. Finally, the signal that has been amplified in this way is down-mixed in a mixer stage M1, M2, M3 from a radio-frequency signal to an intermediate-frequency signal.

In detail, the coupling element KE has a second bandstop filter L1, C1, which is connected to the antenna ANT, is formed from a capacitance C1 with a parallel-connected inductance L1, and is used for suppressing undesirable citizen band radio frequencies. The second bandstop filter L1, C1 is followed by an inductance L3, which acts as a high-pass filter and is connected to ground GND. A first bandstop filter L2, C2, which contains a capacitance C2 with a parallel-connected inductance L2 and is used for suppressing undesirable intermediate frequencies, is provided in the further path of the signal. Finally, the coupling element KE has a capacitive element C3 which forms a low-pass filter, is connected at one end to a reference-ground potential connection GND and is connected to the first bandpass filter L2, C2 as well as to the inputs of the radio-frequency resonant circuits HR1, HR2, HR3 which follow the coupling element KE.

The radio-frequency resonant circuits HR1, HR2, HR3 are each associated with a specific TV frequency band, with the first radio-frequency resonant circuit HR1 being configured for the ultra high frequency (UHF) band, the second radio-frequency resonant circuit HR2 being configured for the high VHF (very high frequency) frequency band, and the third radio-frequency resonant circuit HR3 being configured for the low VHF frequency band.

On the input side, the radio-frequency resonant circuits HR1, HR2, HR3 have a respective inductance L4, L5, L6, connected as a series inductance and used for impedance conversion. The actual resonant circuit is formed by in each case one downstream inductance L7, L8, L9 to ground, as well as a series circuit which is connected in parallel with it and contains a tunable capacitance diode D1, D4, D5 and a capacitance C7, C8, C9. The resonant frequency of the radio-frequency resonant circuits HR1, HR2, HR3 may in each case be set by a common tuning voltage VT which is connected to the capacitance diode D1, D4, D5 via a respective resistor R2, R5, R6. A further series capacitance D2, D3, which is in the form of a capacitance diode, can be provided in the tuning circuits HR2, HR3 that are suitable for the lower frequencies. The third tuning circuit HR3, which is suitable for the lower VHF frequency band, also has a resistor R1 in series with the inductance L9. In order to suppress mirror-image frequencies, the first and third radio-frequency resonant circuits HR1, HR3 have a respective capacitance C4, C6 which is connected in parallel with the series circuit formed by the inductance L4, L6 and the capacitance diode D1, D3. The second radio-frequency reference circuit HR2 has a capacitance C5 that is connected in parallel with the diode D2 in order to widen the bandwidth and/or the tuning range of the second radio-frequency resonant circuit HR2. An RC element R7, C15 is provided for supplying the tuning voltage VT. In the three further signal paths for the three bands, the radio-frequency resonant circuit HR1, HR2, HR3 is followed by a respective coupling capacitance C12, C13, C14, which is connected on one side to the radio-frequency resonant circuit HR1, HR2, HR3 and on the other side to a gate connection of a field-effect transistor T1, T2, T3. The dual-gate transistors T1, T2, T3 have a second gate connection, to which an automatic gain control (AGC) signal can be supplied via a common resistor R11 and a respective resistor R8, R9, R10. The transistors T1, T2, T3 may in this case at the same time be used for band selection. A decoupling capacitance C16, C17, C18, C19 is in each case connected to ground from one end of the respective resistors R8, R9, R10, R11. The source connection of the transistors T1, T2, T3 is connected to the reference-ground potential connection GND. A respective supply voltage V1, V2, V3 can be supplied to the drain connections of the transistors T1, T2, T3 via a respective inductance L11, L12, L13 and decoupled by capacitances C21, C22, C23 which are connected to ground. Furthermore, a respective bandpass filter BP1, BP2, BP3 (which can be tuned by the tuning voltage VT) as well as a mixer M1, M2, M3 connected on the output side is connected to the respective drain connections of the transistors T1, T2, T3. The mixers M1, M2, M3 are used for converting the amplified input signal to an intermediate-frequency signal. Furthermore, a respective local oscillator LO1, LO2, LO3 is provided and, in conjunction with a phase locked loop PLL, produces a frequency which is dependent on the tuning frequency of the radio-frequency resonant circuits HR1, HR2, HR3, such that an intermediate-frequency signal at a fixed frequency can be tapped off at the mixer outputs.

The mixer outputs are connected to one another at the input of a bandpass filter BP4, at whose output a filtered intermediate-frequency signal can be tapped off.

The capacitance C3 allows effective suppression in particular of influences from the central and lower frequency bands on the high UHF frequency band. Overall, the influence of undesirable interference on each of the other frequency bands is effectively suppressed in the described circuit configuration when one frequency band is selected or being used. The three-band TV tuner as shown in the FIGURE does not require any switching diodes for switching between the individual bands. The described input stage has a simple circuit that can be produced with a low level of complexity, at low cost and with only a small chip area being required. Just one additional capacitance C3 makes it possible to connect the signal paths for the individual bands from the resonant circuit to the mixer in parallel in a simple manner. The capacitance C3 in this case acts as a low-pass filter.

The described circuit principle is not restricted to the application in television or video tuners, but may also be used for other radio-frequency applications, depending on the purpose.

I claim:

1. A radio-frequency input stage, comprising:
   a first tunable radio-frequency resonant circuit having an input;
   a second tunable radio-frequency resonant circuit having an input connected to said input of said first tunable radio-frequency resonant circuit; and
   a radio-frequency coupling element for receiving an input signal and coupled to said first and second tunable radio-frequency resonant circuits, said radio-frequency coupling element having a high-pass filter, a bandstop filter connected on an output side of said high-pass filter, and containing a reference-ground potential terminal and a capacitive element having a first terminal coupled to said first and second tunable radio-frequency resonant circuits and a second terminal connected to said reference-ground potential terminal, and each of said first and second tunable radio-frequency resonant circuits having a series inductance on an input side for impedance conversion, with each series inductance connected on an output side of said bandstop filter.

2. The radio-frequency input stage according to claim 1, wherein said capacitive element has a capacitance value of 0.5 picofarads, and the radio-frequency input stage has an overall tuning range from 40 to 870 MHz.

3. The radio-frequency input stage according to claim 1, further comprising an air interface, and said high-pass filter having an inductance with a first terminal coupled to said air interface and to said first and second tunable radio-frequency resonant circuits and a second terminal connected to said reference-ground potential terminal.

4. The radio-frequency input stage according to claim 1, further comprising a third, tunable radio-frequency resonant circuit connected in parallel with said first and second tunable radio-frequency resonant circuits and having an input.

5. The radio-frequency input stage according to claim 4, wherein said third tunable radio-frequency resonant circuit has on an input side a series inductance for impedance conversion, with said series inductance being connected to said coupling element.

6. The radio-frequency input stage according to claim 4, wherein said first, second, and third tunable radio-frequency resonant circuits each has a series circuit formed from a capacitance diode and a capacitance and an inductance disposed in parallel with said series circuit.

7. The radio-frequency input stage according to claim 4, further comprising amplifiers, said first and third tunable radio-frequency resonant circuits each having an output coupled to one of said amplifiers, said first and third tunable radio-frequency resonant circuits each having a capacitance for suppressing mirror-image frequencies and connected between said input of said first and third tunable radio-frequency resonant circuits, which are connected to said coupling element, and said output.

8. The radio-frequency input stage according to claim 5, further comprising an amplifier, and said second tunable radio-frequency resonant circuit has an output connected to said amplifier and a capacitance for widening a bandwidth connected between said series inductance and said output.

9. The radio-frequency input stage according to claim 1, further comprising an antenna connected to said coupling element for receiving the input signal.

10. The radio-frequency input stage according to claim 1, wherein said coupling element has a further bandstop filter connected on an input side of said bandstop filter.

* * * * *